United States Patent
Nediyanchath et al.

(10) Patent No.: US 11,356,083 B1
(45) Date of Patent: Jun. 7, 2022

(54) HIGH-SWITCHING SPEED AND LOW-PHASE-NOISE-ANALOG SYNTHESIZER

(71) Applicant: GigaHz Instruments Inc., Salt Lake City, UT (US)

(72) Inventors: Syama Nediyanchath, Morgan Hill, CA (US); Paul L. Vella, Morgan Hill, CA (US)

(73) Assignee: GigaHz Instruments Inc., Salt Lake City, UT (US)

( * ) Notice: Subject to any disclaimer, the term of this patent is extended or adjusted under 35 U.S.C. 154(b) by 0 days.

(21) Appl. No.: 17/326,072

(22) Filed: May 20, 2021

Related U.S. Application Data (60) Provisional application No. 63/027,753, filed on May 20, 2020.

(51) Int. Cl.
  *H03K 5/00* (2006.01)
  *H03K 5/1252* (2006.01)
  *H03K 5/01* (2006.01)

(52) U.S. Cl.
  CPC ........... *H03K 5/00006* (2013.01); *H03K 5/01* (2013.01); *H03K 5/1252* (2013.01)

(58) Field of Classification Search
  None
  See application file for complete search history.

(56) References Cited

U.S. PATENT DOCUMENTS

| | | | | |
|---|---|---|---|---|
| 5,146,186 | A * | 9/1992 | Vella | H03L 7/185 331/11 |
| 8,373,463 | B1 * | 2/2013 | Chenakin | H03L 7/18 327/156 |
| 8,699,985 | B1 * | 4/2014 | Mar | G06F 1/0328 455/316 |
| 9,628,066 | B1 * | 4/2017 | Chenakin | H03L 7/185 |
| 2013/0069699 | A1 * | 3/2013 | Szilagyi | H03L 7/23 327/156 |

* cited by examiner

*Primary Examiner* — Tuan T Lam
(74) *Attorney, Agent, or Firm* — Patent Law Works LLP (57) ABSTRACT

The present invention is directed to a frequency synthesizer with an improved architecture that eliminates a VCO and a method to build frequency synthesizers for generating high-frequency signals with low phase noise, low spurious, extremely fast switching speed and fine frequency resolution. The synthesizer provides significant improvement in performance, phase noise, switching speed, power, size and cost reduction.

6 Claims, 7 Drawing Sheets

Fig.7 Seed Generator

Fig.8 Seed Generator

Fig.9 Seed Expander.

Fig. 10 Harmonic Multiplier and Filters.

Fig. 11 System Flow Chart.

HIGH-SWITCHING SPEED AND LOW-PHASE-NOISE-ANALOG SYNTHESIZER

CROSS-REFERENCE TO RELATED APPLICATION

This application claims priority from U.S. Provisional Patent Application No. 63/027,753, filed on May 20, 2020, which is incorporated by reference herein in its entirety.

BACKGROUND

1. Field of the Invention

The present invention relates generally to the field of electronic systems including analog synthesizers and phase-locked loop ("PLL") frequency synthesizers. In particular, the present invention is directed to an improved architecture for a high-switching speed and low-phase-analog synthesizer with low or minimal spurious signals, fine resolution, and low power consumption.

2. Description of the Related Art

A frequency synthesizer used in many modern devices, is an electronic circuit that translates a low frequency input reference signal into an output signal at a high frequency, which is a multiplied value of the input reference signal. The output frequency range, step size, phase noise, and spurious signals, are important synthesizer characteristics. Phase noise and spurious performance, which determine the usability of a signal source in user applications have an important trade-off with the complexity of circuits (and power consumption) and ease of integration into an integrated circuit form, to reduce cost.

One of the main factors that determines the phase noise of a system is the phase noise of the voltage-controlled oscillator ("VCO") used in generating a signal that is wide enough to be a basis for synthesis using high frequency wide band VCO. It should be recognized that a voltage-controlled oscillator ("VCO") is an electronic oscillator with an oscillation frequency controlled by a voltage input. The applied input voltage determines the instantaneous oscillation frequency. A VCO is typically used for ease of frequency modulation, phase modulation by applying a modulating signal to the control input. A VCO is also an integral part of a phase-locked loop.

In a wideband frequency synthesizer, the frequency reference is usually derived from a low-noise, high-stability source. To obtain a very low-phase noise signal reference, a very low-noise reference, such as an ultra-low phase noise source like Stress Compensated ("SC") Oven controlled Crystal Oscillator ("OCXO") in combination with a Voltage Controlled Crystal Oscillator ("VCXO") running at a few hundred MHz maximum with very little (next to nothing) tuning range may be used. To improve the phase noise at a few ten kHz offset or higher, a signal source with a very-high Q factor like Dielectric Resonant Oscillator ("DRO")/Surface Acoustic Wave ("SAW")/Bulk oscillator running at a few GHz may be used. This transfers the phase noise of the OCXO, VCXO combination at very-close in offset while improving it at a few ten kHz or higher offsets. However, these high Q sources also have extremely low tuning band width. Hence, the challenge lies in expanding the tuning range provided by the above ultra clean sources without paying a penalty in phase noise degradation for expanding the tuning range. A wideband VCO or YTO (YIG-Tuned Oscillator) that is usually locked to this clean reference. Traditionally, multi-loop configurations have been used to accomplish this, but all of these result in a compromise of both phase noise and tuning speed. The VCOs of high frequency and wide tuning range have inherently poor phase noise. This is made worse by the noise added by the loop itself. The resulting phase noise reflects both of these degradations. The loop structure additionally sets limits on the speed in slewing from one frequency to a new frequency. The phase noise of a VCO is associated with Leeson's equation and can be broken into three distinct regions:

A −30-dB/decade slope for close-in offset frequencies, due to up-conversion of 1/f noise;

A −20-dB/decade slope for intermediate offset frequencies due to limited resonator quality factor (Q); and Flat phase noise for large offsets where performance is dominated by the noise characteristics of the oscillator's active device(s).

As a basic principle, in order to design a circuit with high Q, the tuning bandwidth must be made small. Therefore, a VCO designed for low phase noise performance will have a smaller tuning range. For example, if the tuning bandwidth of an oscillator is doubled (n=2) while maintaining the same center frequency, then the phase noise at a given offset is degraded by 6 dB in 20 dB/decade zone, or by 9 dB in 30 dB/decade zone.

Figure 1:
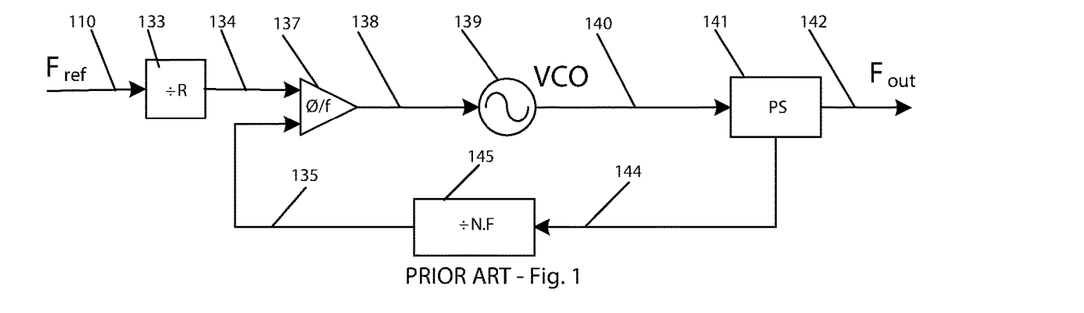
FIG. 1 is a schematic representation illustrating a conventional phase-locked loop synthesizer ("PLL").

By way of example, some configurations in the prior art are described. FIG. 1 is a simplified block diagram illustrating a commercial PLL synthesizer. In this example, R values are typically integers or a combination of a frequency doubler, an integer pre-divider, a multiplier and post divider combinations for spur avoidance. The N dividers typically consists of integers and a fractional divider portion, but this may also be set to an integers-only mode.

To illustrate existing approaches and architectures, by way of example, FIG. 1 shows a simplified block diagram of a conventional PLL frequency synthesizer. This circuit is based on a voltage-controlled oscillator designated by reference numeral 139 ("VCO"), which has a frequency output that is locked in relation to a reference frequency 110 by a feedback loop. In this figure, the voltage-controlled oscillator 139 generates an output signal 140 at frequency $F_{out}$ 142. A portion of this signal is fed back to the phase detector ("PD") 137 via a power splitter ("PS") 141 and a frequency divider 145. The frequency divider has a division ratio of N·F, meaning that its output frequency 135 is N·F times less than its input frequency 144. The other input to the phase detector is a reference frequency signal $F_{ref}$ 110, which may be generated by a high-stability, fixed-frequency oscillator, for example, a crystal oscillator. A signal 134 for phase noise comparison is generated by division of reference frequency signal 110 by R divider 133. The phase detector 137 compares the two signals 134 and 135 at its inputs and generates an error signal 138 that controls the voltage-controlled oscillator 139. Therefore, the phase detector, the VCO, the power splitter and the frequency divider form a loop circuit. The error signal is typically filtered and sometimes amplified before feeding into the voltage-controlled oscillator or VCO. The VCO is locked at relation to $F_{REF}$ given by: $F_{out}=F_{ref}*N·F/R$. Value of N·F is varied to tune the $F_{out}$ frequencies within a tuning range determined by the VCO. The minimal step size or frequency resolution is determined by the fractional part of N·F multiplied by $F_{ref}/R$. The phase noise that limits the sensitivity in many receiver applications is the random frequency fluctuations at the output frequency of a synthesizer, which is determined by the $F_{ref}/R$ signal purity and the N·F multiplication factor for near carrier offsets.

Synthesizer phase noise within the phase-locked loop (PLL) bandwidth is derived by the equation: $L=L_{PD}+20 \log$ N·F, where $L_{PD}$ is the cumulative phase noise of the reference signal, the phase detector, the feedback divider, and other associated circuitry referred to the phase detector input, and N·F is the division ratio of the frequency divider. In practice, the synthesizer phase noise performance is usually limited by large division ratios required to provide high-frequency output with small enough resolution. For example, to obtain 50 MHz frequency step resolution at 29.50 GHz output, the feedback divider ratio is 590, corresponding to 55 dB phase noise degradation. In practical applications, this is usually limited by the Figure of Merit (Noise generated within Phase Detector ("PD")) of the PD and not by reference signal $F_{ref}$.

Figure 2:
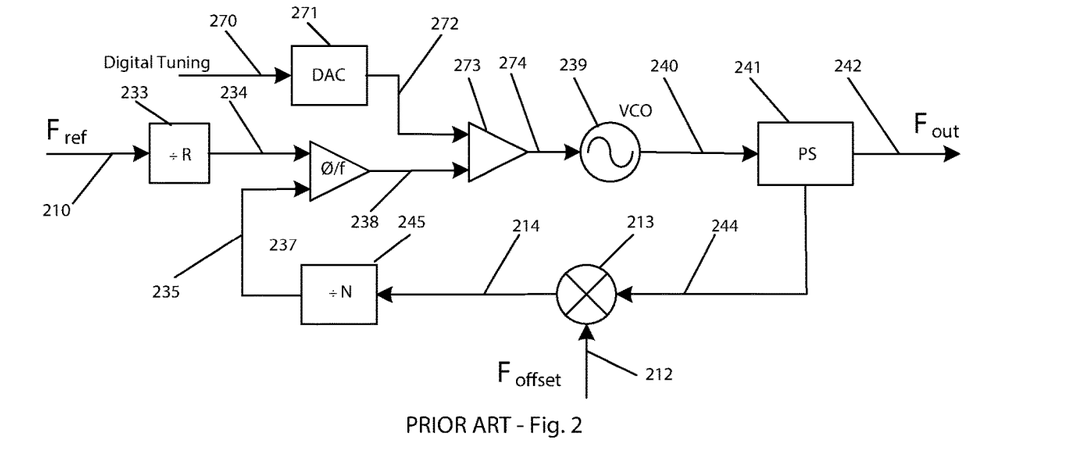
FIG. 2 is a schematic representation illustrating a conventional PLL with direct current ("DC") tuning and frequency offsetting to improve phase noise and speed of frequency switching.

FIG. 2 illustrates a simplified block diagram of a frequency offsetting scheme to improve the phase noise in a narrow band tuned PLL systems. A DAC is used to pre-tune the VCO to near desired destination to reduce the Lock time required and to avoid getting locked to image frequency.

FIG. 2 is a simplified block diagram for a narrow band tuning conventional PLL frequency synthesizer with a frequency offsetting scheme in its feedback loop. In this figure, voltage-controlled oscillator 239 (VCO) generates an output signal 240 at frequency $F_{out}$ 242. A portion of this signal 244 feeds back to the phase and frequency detector 237 ("PFD") via a power splitter 241 ("PS"), a mixer 213 ("Mx"), and a frequency divider 245 with a division ratio of N. The other input 234 to the phase detector 237 is a reference frequency signal $F_{ref}$ 210, passed through a R-divider 233. A Digital-to-Analog Converter ("DAC") 271, adjusted by a tuning word 270 generates a voltage 272 and added to PD error 238 using an operational amplifier 273 is used to tune the VCO 239 to near its destination frequency to avoid a false lock on to image frequency and to improve speed of frequency switching. A mixer 213 by frequency offsetting reduces the maximum frequency division ratio N by reducing the distance between the VCO output in a frequency domain. A low phase noise signal $F_{offset}$ 212 may be generated by another phase-locked loop or frequency multiplication of a clean low frequency source like an OCXO.

Circuits of the type shown in FIG. 2 are often limited to narrow band tuning of VCO systems and often give rise to crossing spurs, an undesirable spurious signal that cross the $F_{out}$ signal within its loop band width, due to the non-harmonic relationship between the offsetting signal and the $F_{out}$ signal.

Figure 3:
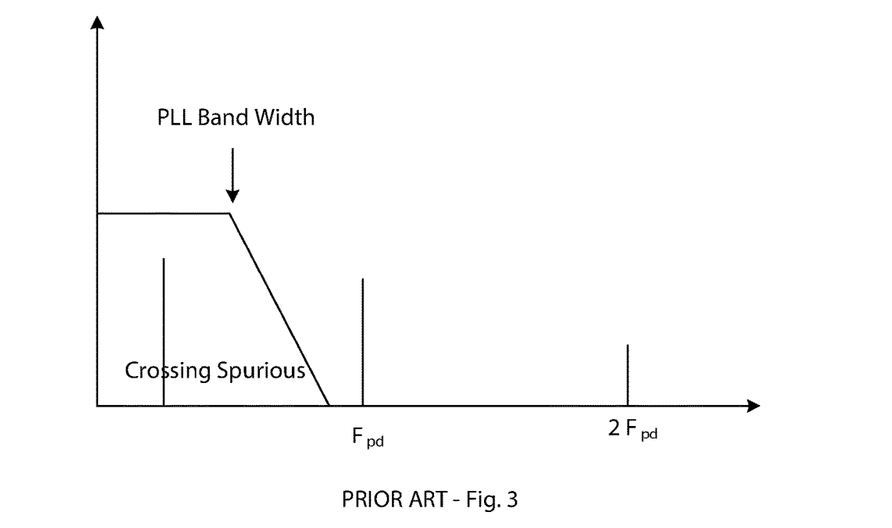
FIG. 3 is a graphical representation illustrating a polluting spurious signal generated as a mixer product in conventional synthesizer employing a frequency conversion.

Also, FIG. 3 illustrates that mixer harmonic and intermodulation products may form undesirable spurious signals. These may fall within the synthesizer loop bandwidth limiting the usefulness of $F_{out}$ signal. FIG. 3 shows a spurious mixer product location as an example of a conventional synthesizer accomplishing a frequency conversion. Use of mixers in PLLs can often result in crossing spurious signals within the PLL band width limiting its usefulness. The frequency divider ("N") present in the loop tends to degrade synthesizer phase noise characteristics.

Figure 4:
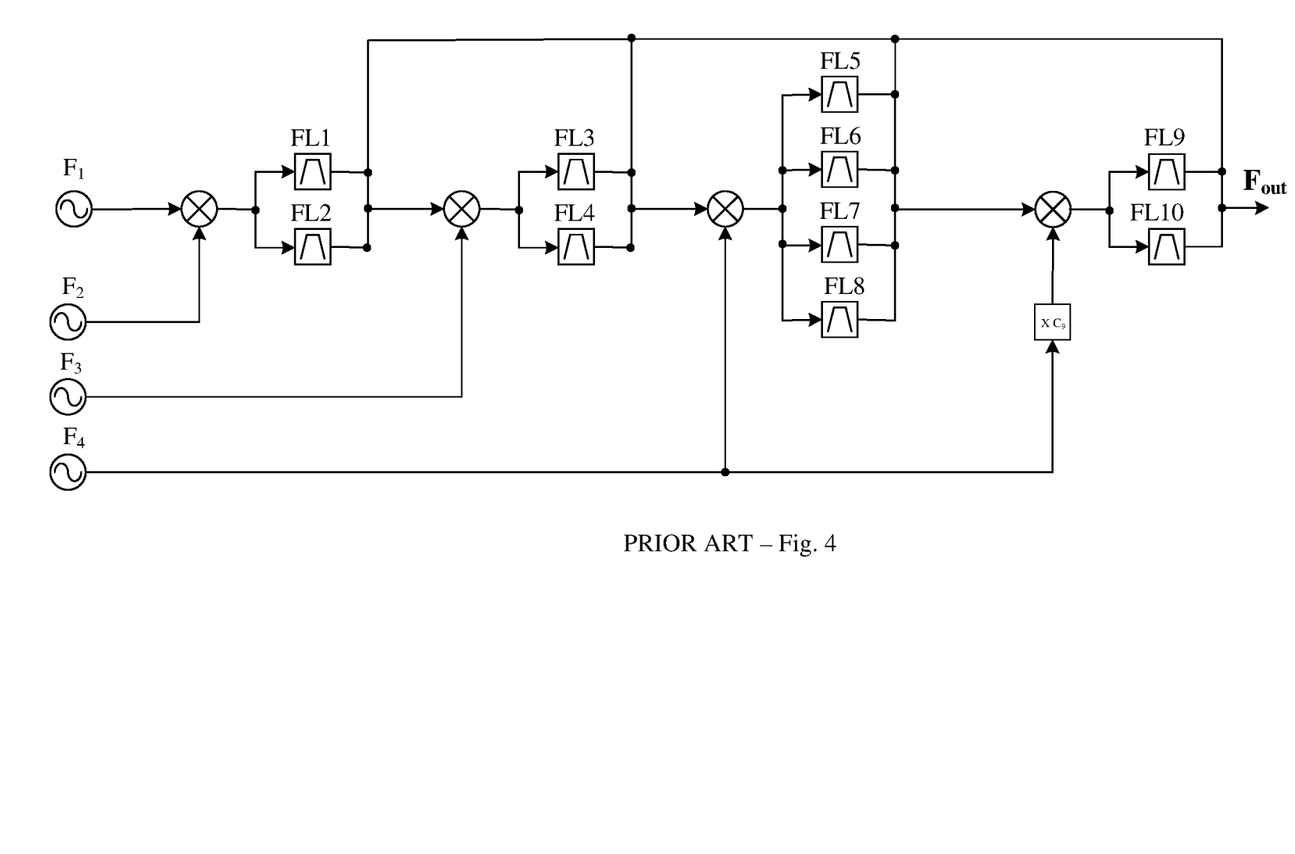
FIG. 4 is a schematic representation of a classical analog synthesizer as proposed in U.S. Pat. No. 4,725,786.

FIG. 4 is a simplified block diagram of a classical analog synthesizer. In a classical analog synthesizer, a series of sources signals are added or subtracted, filtered using filters FL1 through FL10 to remove unwanted spurs to obtain final output $F_{out}$. In this configuration, a reference signal 404 generated by a reference source F1 400 is added to another reference signal 405 generated by source F2 401 by using a mixer 410 and the resultant signal 408 is filtered by band pass filters FL1 409 and FL2 411. The resultant signal 412 is added to another reference signal 406 by using a second mixer 420. The output of this, signal 413 is filtered using band pass filters FL3 419 and FL4 421 to generate signal 422 which is further added to reference signal 407 using mixer 430 and the generated output 431 is filtered using bandpass filters FL5 436, FL6 437, FL7 438 and FL8 439 to generate a signal 441. This signal 441 is further added to a signal 425 generated by harmonic multiplication 424 of reference signal 407. The resultant products 442 are further filtered using Band pass filters FL9 447 and FL10 448 to generate a final output called $F_{out}$ 449. Here the existence of signals that are always alive makes it possible to obtain fast switching capability. A limited amount of filtering can cause the presence of many unwanted signals like crossing spurs that creep through other paths and limits the spurious performance of the circuit and also it tends to limit the frequency range and occupies considerable space and power.

Figure 5:
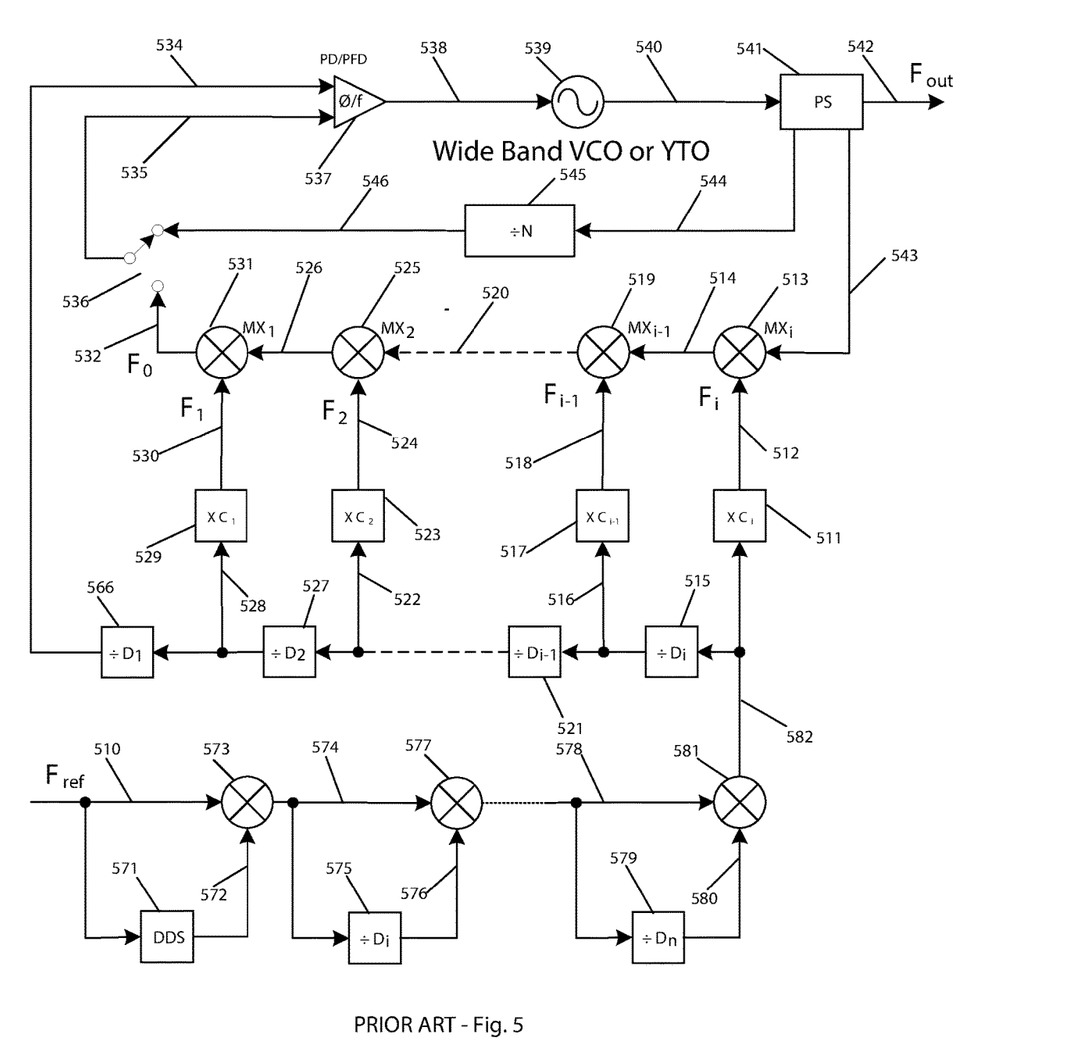
FIG. 5 is a schematic representation of a VCO based, fast-switching, low-phase noise synthesizer as proposed in U.S. Pat. No. 9,628,066.

FIG. 5 illustrates yet another form of frequency synthesizer as described in U.S. Pat. No. 9,628,066 to Oleksandr Chenakin & Syama Nediyanchath. In this type of frequency synthesizer, a $F_{ref}$ is partially spread to form a reference signal to a double-looped, wide-band VCO based PLL structure. This structure consists a reference generator made from $F_{ref}$ 510 added to a signal 572 by using a Direct Digital Synthesis ("DDS") 571 and mixer 573. The resultant signal are mixed using mixers 577, 581 and dividers designated by reference numerals 575, 579 etc. This signal is applied to the double loop structure consisting of mixers Mx1 designated by reference numeral 531 through Mxi designated by reference numeral 513, dividers D1 designated by reference numeral 566 through Di designated by reference numeral 515 and multipliers C1 designated by reference numeral 529 through Ci designated by reference numeral 511. The tuning loop uses the feedback through Divide by N 545 to bring the VCO to correct the destination frequency and the parallel path using the mixers ($M_{x1}$ through $M_{xi}$) used for obtaining low phase noise under locked condition of the loop. The output of this VCO is either multiplied up or divided down to generate other frequencies that are required. This structure has a number of shortcomings, some of which are indicated below:

1. The presence of a wideband VCO tends to limit attainable phase noise.
2. The same fundamental design may be repeated using an Octave-tuning-YTO-based final loop, instead of the wideband VCO. This improves the phase noise performance without altering the frequency scheme or the design itself. However, the YTO by its very nature limits the speed at which frequency may be switched.
3. The double-loop structure is more space intensive and is a sophisticated handover scheme, requiring a tuning loop to final low-phase-noise loop.
4. Once the low-phase-noise loop is engaged, the loop can become more vulnerable to false-lock operation when the VCO is shocked out of its desired location.
5. The loop, if locked at the image frequency is not able to recognize the loss of lock without use of sophisticated loss of lock recognition circuits.

Given the need, other architectures that remedy these limitations are desirable.

SUMMARY

The present invention is directed to a non-VCO architecture to remedy the limitations in current architectures, to provide speed of direct analog synthesis without undue complexity.

The present invention in some embodiments is a broadband microwave synthesizer architecture using continuous expansion of tuning signals, by using a special technique in which the phase-noise penalty is kept to a fraction of the dB, (often less than 0.1 dB) compared to conventional systems with 20*log 10 (BW expansion factor). This technique advantageously replaces the use of a VCO, by using direct-digital synthesis ("DDS") and a stable reference frequency that are frequency translated (mixed) and filtered such that largest frequency steps are controlled by dividers and fine tuning is controlled by DDS.

Figure 7:
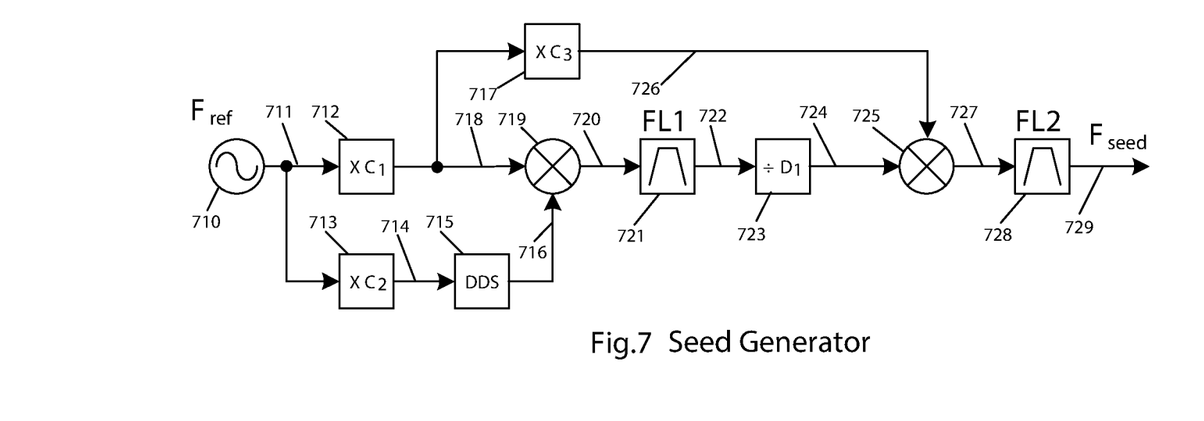
FIG. 7 is an expanded view of schematic representation of a seed generator portion for the improved architecture.
Figure 8:
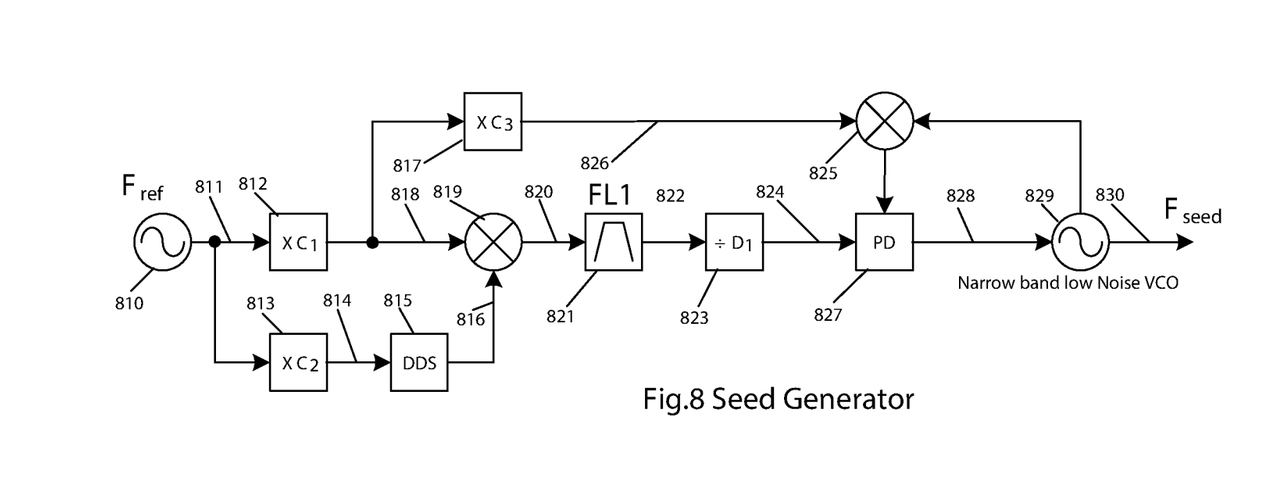
FIG. 8 is a schematic representation of another method of the seed generator using a narrow band VCO/Dielectric Resonator Oscillator ("DRO") source for the improved phase noise performance.
Figure 9:
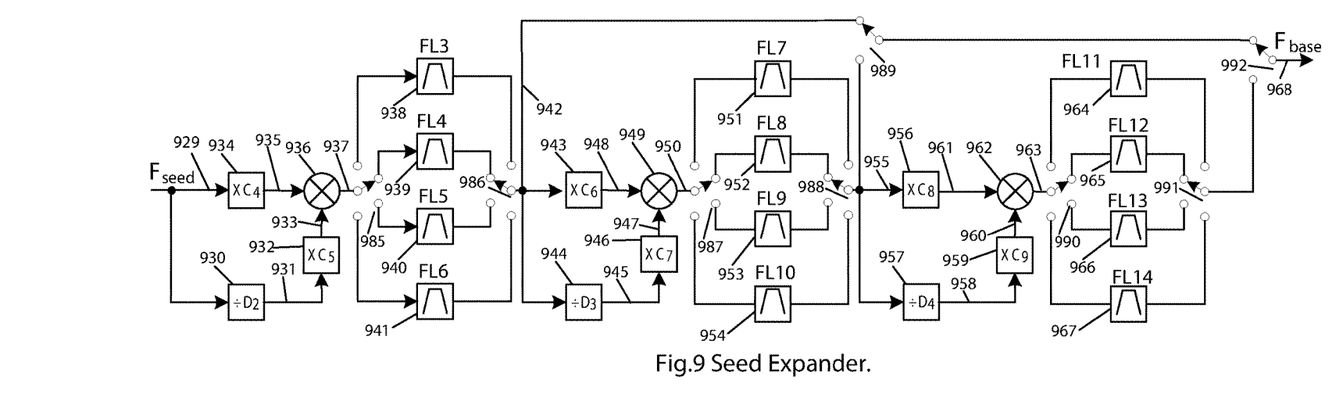
FIG. 9 is a schematic representation of the seed expander generating wide band tuning capability with no penalty of phase noise.
Figure 10:
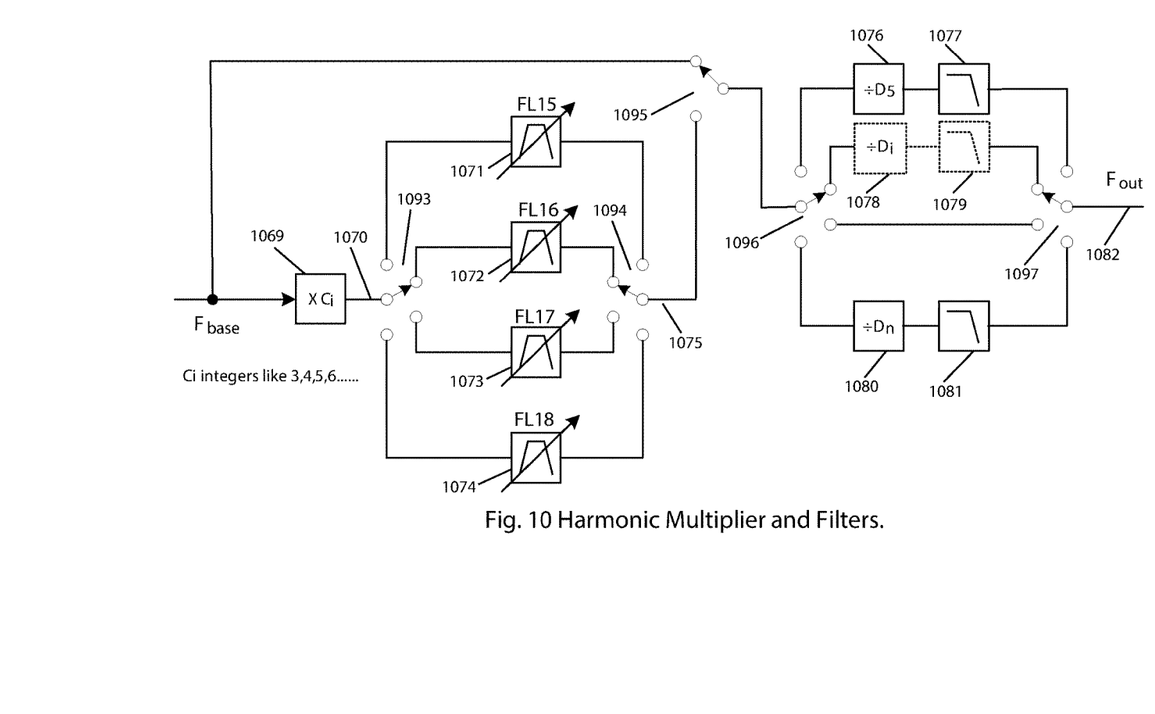
FIG. 10 is a schematic representation of a harmonic multiplier stage for generation of microwaves and multi-decade tuned broad band signal from the output of the expander.

In accordance with one embodiment of the present invention, the synthesizer of the present invention takes the "narrow band tuning seed" generated by method shown in FIG. 7 or FIG. 8 (two ways shown among many others possible) and frequency translates this to continuous wider tuning bands to expand to form a wide band continuous low phase noise signal called Fbase, by using the structure illustrated in FIG. 9. It is noteworthy that this architecture expands the span of frequency coverage from $\Delta F_{seed}$ to $\Delta F_{base}$ without the theoretical expected minimum degradation 20 log $\Delta F_{base}/\Delta F_{seed}$. In FIG. 10 a method to convert this wideband tuning signal to multi-decade covering synthesizer signal using frequency multipliers and dividers is shown. The filters serve to remove both harmonic and non-harmonic spurious signals from the resultant outputs.

BRIEF DESCRIPTION OF THE DRAWINGS

The present invention is illustrated by way of example, and not by way of limitation, in the figures of the accompanying drawing in which like reference numerals are used to refer to the same or similar elements.

DETAILED DESCRIPTION

The following detailed description of embodiments presents various descriptions of specific embodiments of the invention. However, the invention can be embodied in a multitude of different ways as defined and covered by the claims. In this description, reference is made to the drawings, where like reference numerals may indicate identical or functionally similar elements.

Figure 6:
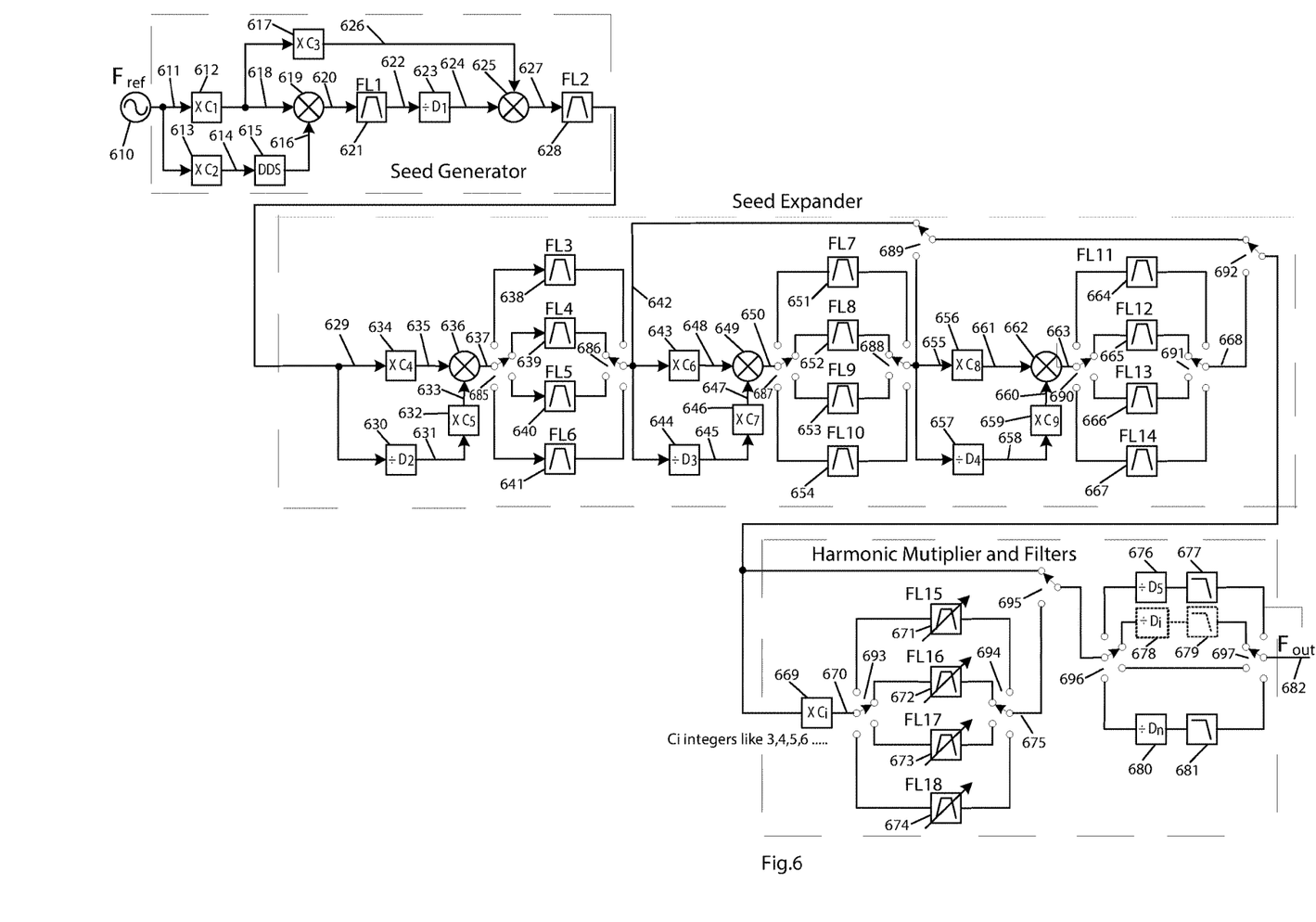
FIG. 6 is an overall schematic representation of an improved architecture for a synthesizer in accordance with the present invention.

The architecture illustrated in FIG. 6 has three portions, namely, a seed generator 610 through 628, a seed expander 629 through 668, and a harmonic multiplier 669 through 682, each of which are shown in FIG. 7, FIG. 8, FIG. 9 and FIG. 10 and are described in detail below.

Referring now to FIG. 7 and FIG. 8, they illustrate two of the many ways by which a narrow band seed may be generated. In the first part shown as a seed generator designated by reference numerals 711, 712, 713 . . . through 728, the improved architecture generates a narrow band of signal, by using a carefully selected band of DDS signal indicated be reference numeral 716 (that provides a very high resolution in tuning), which is added to a very clean high frequency source 718 and filtered at 721, then divided by a very low noise divider 723, resulting in an ultra-clean signal 724 with very low spurious signals, which is then added to a very clean high frequency source 726 to form a seed 729. The phase noise performance of the signal with clean dividers and multipliers is provided by the equation:

$$F_{ref\,pn}+20*\log_{10}(C1*C3)+20*\log_{10}\{(C1*F_{ref\,pn}+DDS_{output\,pn})/D1)\}.$$

Under normal conditions, in real world scenarios, the contribution due to:

$$20*\log_{10}\{(C1*F_{ref\,pn}+DDS_{output\,pn})/D1)\}$$

would be negligible. Thus, the improved architecture is able to derive a fine resolution variable frequency seed with near phase noise performance of:

$$F_{ref\,pn}+20*\log_{10}(C1*C3).$$

Referring now to FIG. 8, the improved architecture uses a narrow-band, low-noise VCO PLL designated by reference numerals 828, 825, 827 as the filter to generate and even enhance phase noise at larger offsets. A reference signal $F_{ref}$ 810 outputs a high purity signal that is harmonically multiplied by a multiplier $C_1$ 812 to give a signal 818 and another branch feed a DDS 815 after a multiplier $C_2$ 813. The output signal 814 forms the reference to the DDS. The DDS output is then added to signal 818 for translation to a higher frequency band output 820. This signal is filtered by a band pass filter FL1 821 and the cleaned signal 822 is divided by a divider $D_1$ 823 and becomes the reference signal 824 for the phase detector PD, the output of which designated by reference numeral 828 drives a narrow band low noise VCO or DRO 829 to generate seed Fseed 830. A portion of the same signal serves as a feedback to a mixer 825 to be mixed with a reference signal 826 generated by multiplication of signal 818 by a multiplier C3 817. The phase noise performance of the signal with clean dividers and multipliers is provided by the equation:

$$F_{ref\,pn}+20*\log_{10}(C_1*C_3)+20*\log_{10}\{(C_1*F_{ref\,pn}+DDS_{output\,pn})/D1)\}.$$

Under normal conditions, in real world scenarios, the contribution due to $20*\log_{10}\{(C_1*F_{ref\,pn}+DDS_{output\,pn})/D1)\}$ would be negligible. Thus, the improved architecture is able to derive a fine resolution variable frequency seed with near phase noise performance of $F_{ref\,pn}+20*\log_{10}(C1*C3)$.

The second part of the improved architecture is called an expander of the seed. As shown in FIG. 9 a $F_{seed}$ signal 929 is divided by a divider 931 and its output or its harmonics 932 is mixed using a mixer 936 to generate an expanded form at 937. It is filtered using narrow band filters designated by reference numerals 938, 939, 940, 941, then switched in and out using switches 985 and 986 to eliminate unwanted harmonic mixing products. The same scheme of expansion as in two more stages as those designated by reference numerals 943, 944, 945, 946, 949, forming a stretcher and those designated by reference numerals 951, 952, 953, 954 as filters Switched in and out using Switch 987 and 988 as needed. Depending on the Fbase width required one may add more stages of seed expander. Here a third stage formed by components designated by reference numerals 956, 957, 959, 962 and filters designated by reference numerals 964, 965, 966, 967 Switched in and out using Switch 990 and 991 as needed. The signals from earlier stages may also be forwarded using switches 989 and 992 as shown above to obtain maximum utilization of the various stages. FIG. 9 shows a scheme of $F_{seed}$ expansion to $F_{base}$ even up to cover over an octave width, although not always necessary depending on multipliers used in the final section. For example, if harmonics in 669 varies as 3,4,5 then $F_{base\_max}/F_{base\_min}=1.33$ is sufficient to make the resultant final signal an octave covering.

The seed expander as in FIG. 9 results in phase noise degradation provided by the equation:

$$20*Log_{10}\{(C4+C5/D2)*(C6+C7/D3)*(C8+C9/D4)\}$$

As long as C4>5*C5/D2 and C6>5*C7/D3 and C8>5*C9/D4, the total noise added with respect to an ideal case of $20*Log_{10}\{(C4*C6*C8)\}$ with Fraction of a dB penalty of noise due to tuning width expansion, and is negligible while the tuning range of the seed is expanded by many folds. With a variable $F_{seed}$ varying between $F_{seed1}$ to $F_{seed2}$ by equating:
$F_{seed1}*C4+F_{seed1}*C5/D2_{min}$ to $F_{seed2}*C4+F_{seed2}*C5/(D2_{min}+1)$, a continuous coverage in output spectrum can be ensured. In the simplest case of C4 and C5 equated to one, this reduces such that $D2_{min}$ can be evaluated as integer part of Square root of the ratio between the $F_{seed1}/(F_{seed2}-F_{seed1})$ and can be written as $D_{2min}$=integer $\{[F_{seed1}/(F_{seed2}-F_{seed1})]^{1/2}\}$.
Similarly, with a variable $F_{seed}$ varying between $F_{seed1}$ to $F_{seed2}$ by equating:
$F_{seed1}*C4-F_{seed1}*C5/(D2_{min}+1)$ to $F_{seed2}*C4-F_{seed2}*C5/D2$ mm, a continuous coverage in output spectrum may be ensured. In the simplest case of C4 and C5 equated to one, this reduces such that $D2_{min}$ may be evaluated as integer one greater than square root of the ratio between the $F_{seed1}/(F_{seed2}-F_{seed1})$ and the equation may be written as:

$$D_{2min}=integer\{1+[F_{seed1}/(F_{seed2}-F_{seed1})]^{1/2}\}.$$

In a normal VCO, for every doubling of tunable band width, the phase noise performance tends to degrade by 6 dB [20 $log_{10}(2)$]. However, in the above scheme, the degradation in phase noise may be kept to be a fraction of a dB. Thus, a reference or its multiplied form (with 20 log(n) where n is the multiplication factor) is added to a frequency divided form or its harmonics to give an expanded version of high purity signal. This signal passed through appropriate band limiting filters form a wide tuning source with extremely low-phase noise and very low spurious content. Using a signal source in few GHz range, it is possible to easily expand the tuning range using very clean frequency dividers using this technique. Thus, this improved architecture obtains a wide tuning signal with extremely low phase noise. Even if one was to use multiple phased lock loops to achieve this tuning range expansion, the amount of circuitry required, and the power and space consumption would be greatly increased. The number of stages of the expander used depends on the requirements as calculated depending on the output requirements.

Referring now to FIG. 10, in the third part shown, this signal may further be multiplied up using harmonic multipliers $C_i$ 1069 or divided down using dividers ($D_5$ 1076, $D_j$ 1078, $D_n$ 1080) to and along with appropriate filtering schemes (FL15 1071, FL16 1072, FL17 1073, FL18 1074) along with Switches 1093 and 1094 and Filters (1077,1079, 1081 etc) along with switches 1096 and 1097, to obtain signals that stretch from very low frequency to many tens of gigahertz at $F_{out}$ 1082. In many high frequency applications like 5G communications, these signals with very good near carrier phase noise significantly improve performance of the systems.

An important advantage to point out is that tuning is accomplished by setting simple digital registers for things such as divide numbers. These are inherently fast as opposed to the pre-tuning and frequency slewing of a PLL and its VCOs, regardless of the exact architecture.

Another convenient fact is the complete use of digital circuits, thus avoiding delays associated with PLL tuning time, delays, avoidance of false lock, temperature or time effects resulting in extremely fast switching, highly stable signal source. By careful choice of filters and frequency bands, it is possible to obtain very low spurious signal outputs.

Another possible application of the extremely clean signal obtained from the stretcher is to use it as a reference source to tune the integrated low form factor VCO controlled circuits.

Thus, the improved architecture has several unique advantages as follows:
very high speed of frequency switching;
Very low phase Noise;
Immunity from Component aging or temperature effects;
Very low physical space occupied;
architecture is not susceptible to lock errors; and
reasonably fine resolution is implemented in one loop (much finer than $F_{pd}$), requiring much less tune range in $F_{ref}$ section.

Therefore, as compared to conventional PLL synthesizers, the improved method provides significant performance improvement, reliability, low phase noise, fast switching speeds and very compact, low-cost synthesizers.

Figure 11:
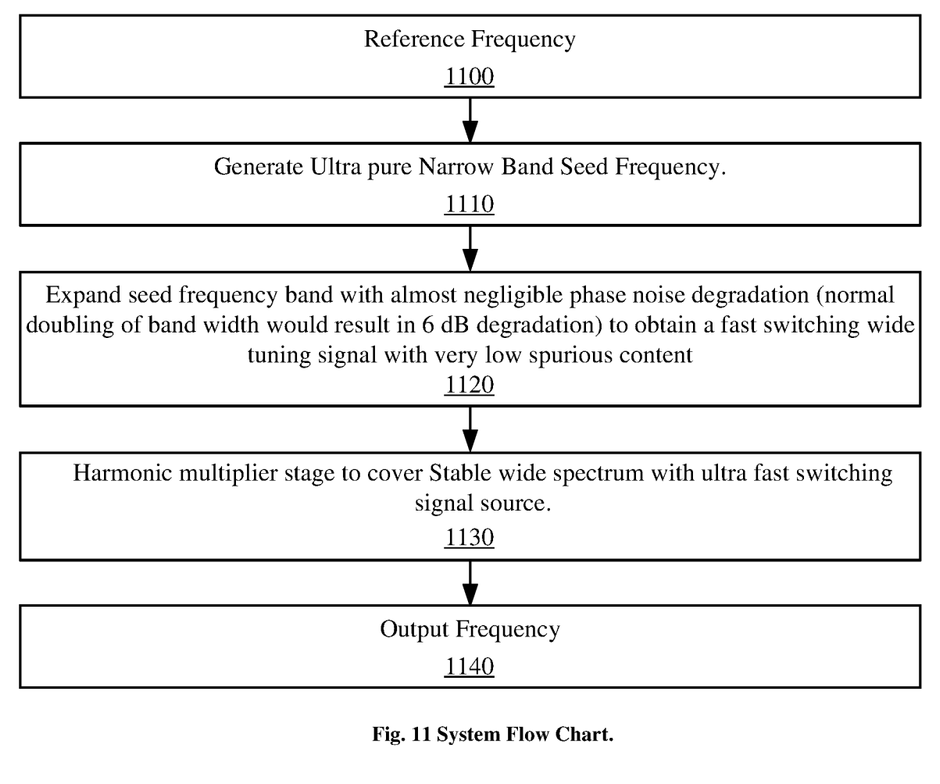
FIG. 11 is a flow chart of the improved overall approach in accordance with the present invention.

Referring now to FIG. 11, a simplified flow chart is illustrated explaining the various functions involved in this new architecture. This figure illustrates the way by which a high purity fixed reference source 1100 is passed through a seed generator 1110 to generate a high purity narrow band reference signal. This signal tuning band width is expanded using a spreader 1120 which adds almost no noise (as compared to conventional degradation of 6 dB for every doubling of tuning band width. This expanded tuning band width signal $F_{base}$ is sent through harmonic multiplier, dividers and filter stage 1130 to generate high performance signals varying from few ten MHz to tens of GHz.

In the description above, for purposes of explanation, numerous specific details are set forth in order to provide a thorough understanding of this technology. It will be apparent, however, that this technology can be practiced without some of these specific details. In other instances, structures and devices are shown in block diagram form in order to avoid obscuring the innovative aspects. For example, the present technology is described by an example implementation above with reference to particular hardware and software.

It should be recognized that reference in the specification to "one implementation or embodiment" or "an implementation or embodiment" simply means that a particular feature, structure, or characteristic described in connection with the implementation or embodiment is included in at least one implementation or embodiment of the technology described. The appearances of the phrase "in one implementation or embodiment" in various places in the specification are not necessarily all referring to the same implementation or embodiment.

Some portions of the detailed descriptions above are presented in terms of equations, which are algorithms and symbolic representations of operations that may be implemented in circuitry or on data bits within a computer memory. These algorithmic descriptions and representations are the means used by those knowledgeable in the data processing and electronic arts to most effectively convey the substance of their work to others in the art. An algorithm and or equation is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers or the like.

It should be borne in mind, however, that all of these and similar terms are to be associated with the appropriate physical quantities and are merely convenient labels applied to these quantities. Unless specifically stated otherwise, as apparent from the following discussion, it is appreciated that throughout the description here, any discussions utilizing terms such as "processing" or "computing" or "calculating" or "determining" or "displaying" or the like, refer to the action and processes of an electronic or computer system, or similar electronic component or computing device, that may manipulate and transforms data represented as physical (electronic) quantities within associated electronic or computer system's registers and memories into other data similarly represented as physical quantities within the electronic system or computer system memories or registers or other such information storage, transmission or display devices.

The present technology with circuitry maybe used in an apparatus for performing the operations described and more and the processes described may be associated with computer programs for operating algorithms used for the manufacture or operation of the electronic systems described here. This apparatus may be specially constructed for the required purposes, or it may be associated with at least a general-purpose computer selectively activated or reconfigured by a computer program stored in the computer to thereby create a special-purpose computer. Such a computer program may be stored in a computer readable storage medium, such as, but is not limited to, any type of disk including floppy disks, optical disks, CD-ROMs, and magnetic disks, read-only memories (ROMs), random access memories (RAMs), EPROMs, EEPROMs, magnetic or optical cards, flash memories including USB keys with non-volatile memory or any type of media suitable for storing electronic instructions, each coupled to a computer system bus.

The present technology can take the form of an entirely hardware embodiment or an implementation containing both hardware and software elements. In some implementations, this technology maybe at least partially implemented in software, which includes but is not limited to, firmware, resident software, microcode, etc.

Furthermore, the process of implementing or building this technology may use a computer program product accessible from a computer-usable or computer-readable medium providing program code for use by or in connection with a computer or any instruction execution system. For the purposes of this description, the steps of the overall process are implemented on a computer-usable or computer readable medium, which can be any apparatus that can contain, store, communicate, propagate, or transport the program for use by or in connection with the instruction execution system, apparatus, or device.

The above description of the embodiments of the present invention has been presented for the purposes of illustration and description. It is not intended to be exhaustive or to limit the present invention to the precise form disclosed. Many modifications and variations are possible in light of the above teaching.

The invention claimed is:

1. An apparatus, comprising:
a microwave synthesizer architecture including a direct digital synthesis (DDS) and a stable reference frequency that are mixed and filtered, one or more largest frequency steps controllable by one or more dividers with fine tuning by said direct digital synthesis forming a seed generator.

2. An apparatus of claim 1, further comprising:
a voltage-controlled oscillator configured to follow said seed generator to eliminate noise and spurs from a carrier.

3. An apparatus of claim 2, wherein the microwave synthesizer takes a seed frequency generated by said seed generator and multiplies and translates said seed frequency to continuously cover an octave or more by using mixing, filtering and dividing operations to expand the span of frequency coverage with maintaining degradation of phase noise to less than a fraction of a dB by using a frequency stretching scheme.

4. An apparatus of claim 1, wherein the microwave synthesizer takes a seed frequency generated by said seed generator and multiplies and translates said seed frequency to continuously cover an octave or more by using mixing, filtering and dividing operations to expand the span of frequency coverage with maintaining degradation of phase noise to less than a fraction of a dB by using a frequency stretching scheme.

5. The apparatus of claim 3, wherein said microwave synthesizer is configured to raise said seed frequency up to an octave frequency range from a base value to a broader frequency range, by using one or more harmonic multipliers, dividers and filters that are switched in and out to extend an output to between low and high frequencies.

6. The apparatus of claim 4, wherein said microwave synthesizer is configured to raise said seed frequency up to an octave frequency range from a base value to a broader frequency range, by using one or more harmonic multipliers, dividers and filters that are switched in and out to extend an output to between low and high frequencies.

* * * * *